United States Patent
Krishnamurthy et al.

(10) Patent No.: US 6,181,166 B1
(45) Date of Patent: Jan. 30, 2001

(54) TRISTATE DRIVER FOR INTEGRATED CIRCUIT INTERCONNECTS

(75) Inventors: Ram K. Krishnamurthy; Soumyanath Krishnamurthy, both of Portland, OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/099,993

(22) Filed: Jun. 19, 1998

(51) Int. Cl.[7] .................................................. H03K 19/0175
(52) U.S. Cl. .................................................. 326/83; 326/86
(58) Field of Search ............................... 326/17, 56, 57, 326/58, 80, 81, 83, 86, 121

(56) References Cited

U.S. PATENT DOCUMENTS

| | | | |
|---|---|---|---|
| 5,115,150 | * 5/1992 | Ludwig ................................. | 307/475 |
| 5,469,081 | * 11/1995 | Horita et al. ......................... | 326/81 |
| 5,654,648 | * 8/1997 | Medhekar et al. .................... | 326/17 |
| 5,656,970 | * 8/1997 | Campbell et al. .................... | 327/564 |
| 5,717,342 | * 2/1998 | Lotfi et al. ............................ | 326/17 |
| 5,883,531 | * 3/1999 | Kuo ....................................... | 327/108 |
| 5,976,473 | * 11/1999 | Krishnamurthy et al. ............. | 326/83 |

OTHER PUBLICATIONS

Krishnamurthy, R.K., et al., "Exploring the Design Space of Mixed Swing QuadRail for Low–Power Digital Circuits", *IEEE Transactions on Very Large Scale Integration (VLSI) Systems*, 388–400 (Dec. 1997).

Krishnamurthy, R.K., et al., "Static Power Driven Voltage Scaling and Delay Driven Buffer Sizing in Mixed Swing QuadRail for Sub–1V I/O Swings", *ISLPED*, 381–386 (1996).

Mooney, R., et al., "A 900 Mb/S Bidirectional Signaling Scheme", *IEEE Journal of Solid–State Circuits*, 1538–1543 (Dec. 1995).

Nakagome, Y., et al., "Sub–1–V Swing Internal Bus Architecture for Future Low–Power ULSI's", *IEEE Journal of Solid–State Circuits*, 414–419 (Apr. 1993).

* cited by examiner

*Primary Examiner*—Michael Tokar
*Assistant Examiner*—Anh Tran
(74) *Attorney, Agent, or Firm*—Schwegman, Lundberg, Woessner & Kluth, P.A.

(57) ABSTRACT

A signal driver circuit uses a single power supply to provide differential low voltage swing signals for use in an integrated circuit. The driver reduces interconnect voltage swing and power consumption, while improving the speed performance of the interconnect. The driver includes series coupled drive transistors to provide differential signals on integrated circuit interconnects. The driver circuit can include circuitry to place the interconnects in a tri-state condition to allow for shared interconnects. An integrated circuit, such as a processor, includes first and second differential interconnects, a receiver circuit connected to the first and second differential interconnects for detecting a differential voltage provided thereon, and a driver circuit connected to the first and second differential interconnects for providing the differential voltage.

30 Claims, 6 Drawing Sheets

TRISTATE DRIVER FOR INTEGRATED CIRCUIT INTERCONNECTS

FIELD OF THE INVENTION

The present invention relates generally to integrated circuit interconnects and in particular the present invention relates to driver circuits for integrated circuit interconnects.

BACKGROUND OF THE INVENTION

Integrated circuits are fabricated to include multiple circuits performing different functions. These circuits are physically distributed across the integrated circuit and often need to communicate with each other. The communication, therefore, is accomplished using complex, and often long, interconnect lines, or buses.

Rapidly increasing integration density, in combination with on-die heat dissipation problems, has motivated a strong interest in exploring low-power/low-voltage circuit methodologies, while retaining high performance. As the integration density increases, major on-chip performance bottlenecks are experienced as a result of long point-to-point interconnects between and within an integrated circuit Functional Unit Blocks (FUB's). This is primarily because interconnect capacitance per unit length, dominated by sidewall fringing and cross-coupling, increases with lateral dimension scaling.

Mixed (multiple) voltage swing based CMOS circuit techniques have been studied previously for high performance/low power on-chip data path interconnects. See for example Nakagome et al., "Sub-1-V Swing Internal Bus Architecture for Future Low-Power ULSI's", IEEE Journal of Solid-State Circuits, April 1993, pp. 414–419, and Krishnamurthy et al., "Exploring the Design Space of Mixed Swing QuadRail for Low Power Digital Circuits", IEEE Transactions on VLSI Systems, December 1997, pp. 388–400 for different mixed voltage swing based CMOS circuit techniques. The general principle behind these approaches is to suppress voltage swings across long interconnects by employing an additional pair of power supply rails (Vdd2 and Vss2). driver circuit is used to receive an input signal and provides an output signal on internal interconnect lines. The output signal is limited to voltage swings between Vdd2 and Vss2. The voltage power rails, Vdd2 and Vss2, can be externally provided, or internally generated. For a given Vdd1 and Vss1, reducing the low voltage swing Vdd2–Vss2) offers a nearly linear, to quadratic, reduction in interconnect power depending on how the additional pair of power rails are generated, eg., by employing on-chip series regulation or off-chip switching regulation techniques. Providing the additional voltage supply creates a burden, particularly in low-voltage circuits. This burden is created by both area penalty of generating the power supply and penalties in routing the addition power rails throughout the integrated circuit. Further, the additional power supply must provide the drive current needed to drive long bus lines. Thus, a low voltage, high current second power supply would be needed.

For the reasons stated above, and for other reasons stated below which will become apparent to those skilled in the art upon reading and understanding the present specification, there is a need in the art for a driver circuit for on-chip interconnects which does not require an additional power supply, but reduces interconnect voltage swing and power consumption, while improving the speed performance of the interconnect.

SUMMARY OF THE INVENTION

The above mentioned problems with driving integrated circuit interconnects and other problems are addressed by the present invention, and will be understood by reading and studying the following specification. A signal driver circuit is described which uses one pair of voltage rails, or power supply connections to provide a low voltage swing signal for use in an integrated circuit.

In particular, an interconnect driver circuit comprising first series connected transistors coupled between voltage supply connections is described. The first series connected transistors drive a first voltage signal on a first interconnect in response to a data signal. The first voltage signal has a voltage swing which is less than a voltage differential between the voltage supply connections. Second series connected transistors are also coupled between the voltage supply connections. The second series connected transistors drive a second voltage signal on a second interconnect in response to a complement of the data signal, the second voltage signal has a voltage swing which is less than the voltage differential between the voltage supply connections. The interconnect driver circuit can also include tri-state circuitry coupled to the first and second series connected transistors for placing the first and second interconnects in a tri-state condition.

In another embodiment, an integrated circuit device comprises first and second differential interconnects, a receiver circuit connected to the first and second differential interconnects for detecting a differential voltage provided thereon, and a driver circuit connected to the first and second differential interconnects for providing the differential voltage. The driver circuit is connected to a single voltage supply, and the differential voltage has a voltage swing which is less than a voltage differential of the single voltage supply. The driver circuit comprises first and second series connected transistors coupled to the single voltage supply. The first series connected transistors drive a first voltage signal on the first interconnect in response to a data signal, and the second series connected transistors drive a second voltage signal on the second interconnect in response to a complement of the data signal. Tri-state circuitry is coupled to the first and second series connected transistors for placing the first and second interconnects in a tri-state condition.

A method is provided for communicating data in an integrated circuit using internal interconnects. The method comprises receiving a data signal, and providing differential voltage signals on a pair of interconnects in response to the data signal using a single pair of voltage rails. The differential voltage signals have a voltage swing which is less than a voltage differential of the single pair of voltage rails. The method also comprises detecting the differential voltage signals using a receiver circuit.

DETAILED DESCRIPTION OF THE INVENTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 1:
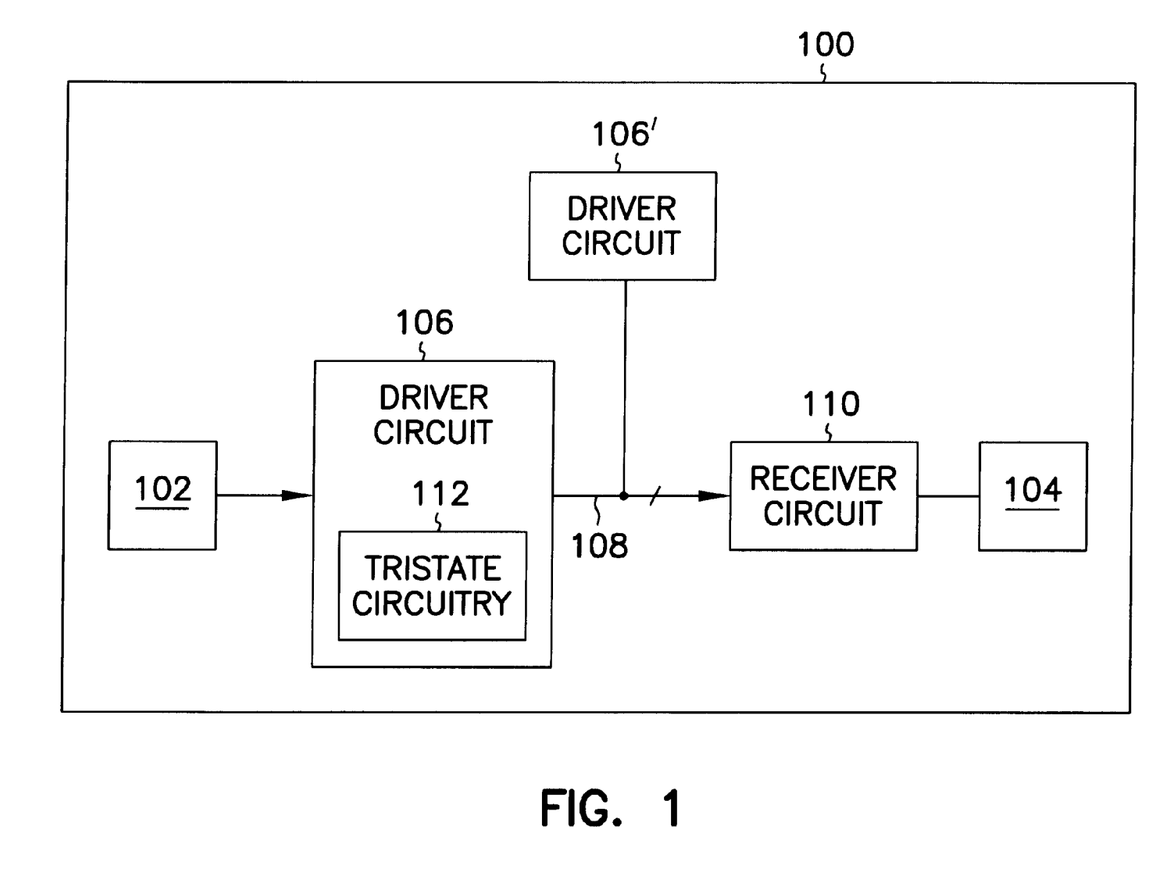
FIG. 1 is a block diagram of an integrated circuit of the present invention.

Source follower based mixed swing circuitry is described herein which eliminates the need for an additional pair of power supply rails required by existing techniques. The described circuitry employs a fully differential, tri-state NMOS-only driver to drive point-to-point on-chip data path interconnects. FIG. I illustrates a block diagram of an integrated circuit 100 which provides communication between a first circuit 102, or Functional Unit Block, and a second circuit 104. The integrated circuit 100 can be any type of integrated circuit, including, but not limited to, processors, controllers, memory devices, and application specific integrated circuits (ASIC). Signals provided by the first circuit 102 are driven by a driver circuit 106 over internal interconnects 108. The driver circuits 106 and 106' provide differential signals on the interconnects which have a reduced voltage swing that is less than a voltage differential of a single power supply, or a single pair of voltage rails. Tri-state circuitry 112 is provided in drive circuitry 106 to selectively place the internal interconnects 108 in a tri-state condition. A receiver circuit 110 detects the differential signals and provides an output, restored to full power rails, to the second circuit 104.

The driver circuit described herein provides a static output. That is, the interconnect voltage swing is switched only when input data transitions. As such, interconnect dynamic power drops linearly with the reduced bus switching activity. This represents a substantial savings in power compared to other dynamic low swing approaches which precharge and evaluate the bus every cycle, independent of input data activity, contributing to a large dynamic power loss at low input data activities.

FIGS. 2–5 illustrate four embodiments of a driver circuit according to the present invention. Each circuit shares the power and ground rails (Vdd1 and Vss1) with peripheral circuitry (operating at CMOS levels, Vdd1–Vss1), and does not require an additional power supply.

Figure 2:
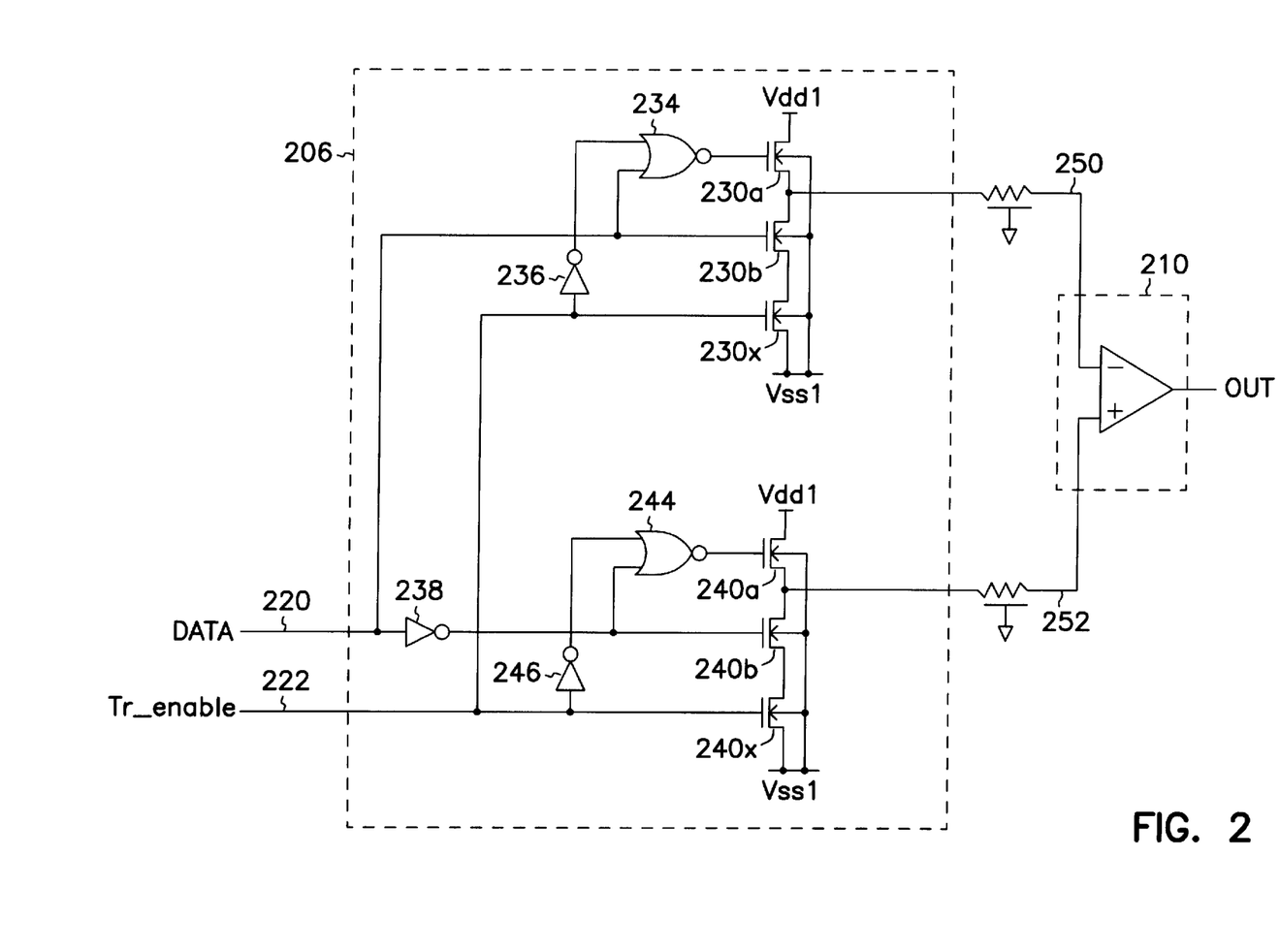
FIG. 2 is a schematic diagram of a driver circuit of the present invention.

Referring first to FIG. 2, a driver circuit 206 is illustrated which receives an input signal on node 220 and provides a differential output on interconnect lines 250 and 252. The interconnect lines 250 and 252 are generally illustrated as having a line resistance and bulk capacitance. It will be understood that the electrical characteristics will be dictated by the layout and fabrication of the integrated circuit. The driver circuit 206 also receives a tri-state enable signal (Tr_enable) on node 222 to place the differential outputs in a tri-state condition such that additional driver circuits (see FIG. 1) can actively drive the interconnect lines 250 and 252.

The driver circuit 206 includes first series connected transistors 230*a*, 230*b*, 230*x* and second series connected transistors 240*a*, 24*b*, 240*x*. In general, transistors 230*a* and 240*a* are pull-up transistors, transistors 230*b* and 240*b* are pull-down transistors, and transistors 230*x* and 240*x* are tristate transistors for the two interconnects. These transistors are preferably n-channel field effect transistors (FET) used to drive the interconnect lines 250 and 252 and define the voltage swing provided in these interconnect lines. A substrate connection for the drive transistors 230*a*, 230*b*, 230*x* and 240*a*, 24*b*, 240*x* are coupled to Vss1, in this embodiment.

The tri-state enable signal provided on node 222 is coupled to the gate of tristate transistors 230*x* and 240*x*. When the Tr_enable signal is in a low state, these transistors are turned off. Likewise, inverters 236 and 246 force NOR gates 234 and 244, respectively, to have a low output. As such, transistors 230*a* and 240*a* are turned off. The interconnect lines 250 and 252, therefore, are placed in a tri-state condition, and the interconnect lines can be driven by an additional driver circuit. It will be appreciated by those skilled in the art that the logic gate 234 of the tristate circuitry, including 234, 236, 238, 244 and 246, could be adapted to control the gate of the pull-down transistor 230*a* or 240*a* by placing the tristate transistor 230*x* or 240*x* in the pull-up circuit. That is, the tristate transistor would be placed between the interconnect line connection and Vddl.

In operation (Tr_enable is high), true and complementary data signals from input line 220 drive the NMOS driver transistors 230*a*, 230*b* and 240*a*, 240*b*. Thus, transistors 230*x* and 240*x* are activated and the output of NOR gates 234 and 244 are controlled by true and complementary data signals 220. Transistors 230*b* and 240*b* are controlled directly by the data signals. Note that inverter 238 is included to provide a complementary data signal in response to data line 220. The voltage signal on the interconnect lines transition between Vdd1–Vt and Vss1, where Vt is the threshold voltage drop of transistor 230*a* or 240*a*. A fully differential sense amplifier 210 regenerates a regular voltage swing signal (Vdd1–Vss1) at a receiving end of the interconnect lines in response to the differential signals on lines 250 and 252.

Figure 3:
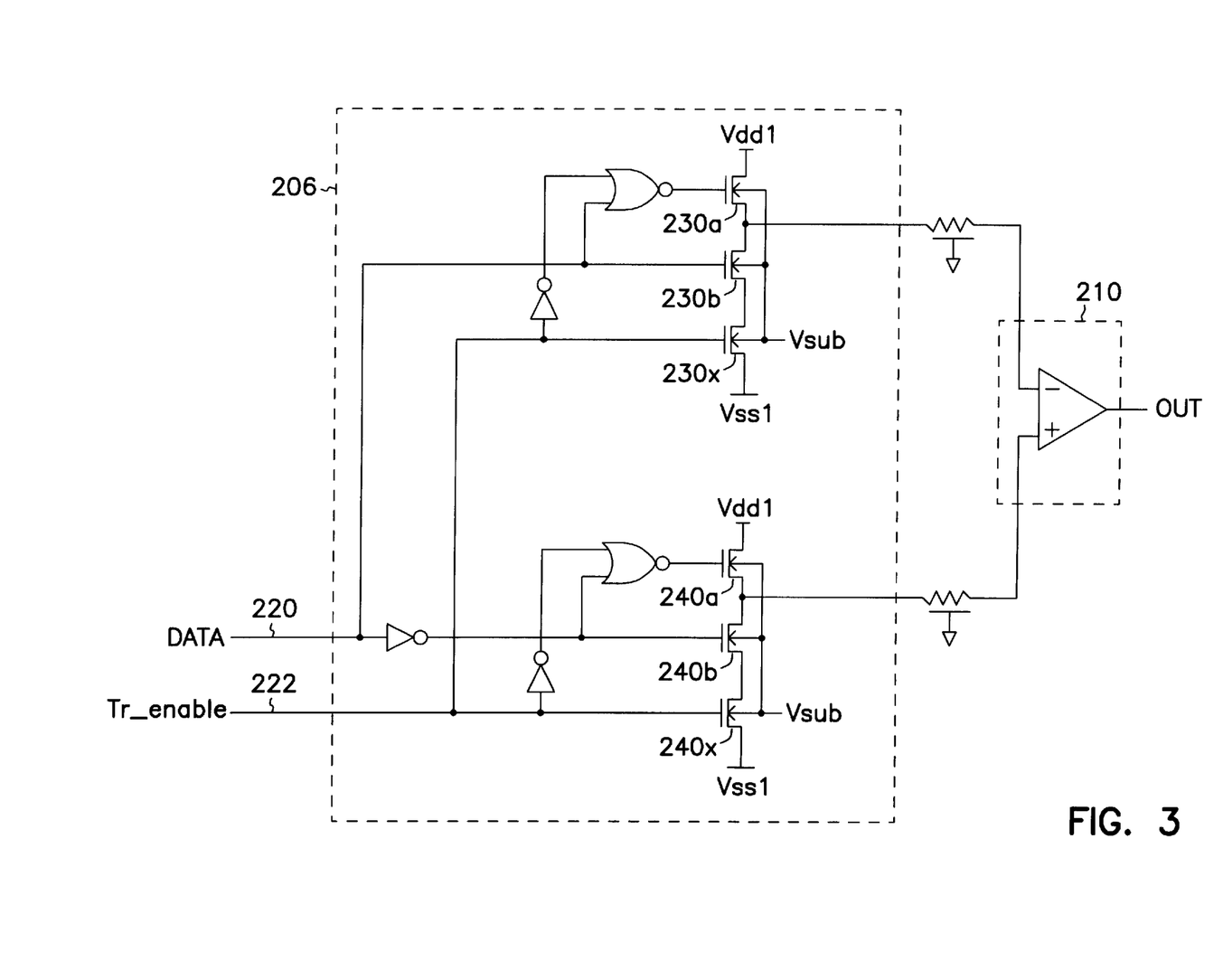
FIG. 3 is a schematic diagram of an alternate driver circuit of the present invention.

An alternate embodiment of the driver circuit is illustrated in FIG. 3. The driver circuit 206 includes series drive transistors 230*a–x* and 240*a–x* which have their substrate connected to a substrate voltage, Vsub, which is greater than Vss1. The interconnect voltage, therefore, transitions between Vdd1–n*Vt and Vss1, where, n represents the extent to which the signal swing is suppressed by the back-bias applied to the substrate rails (Vsub–Vss1). While the increase in back-bias increases the voltage swing on the interconnect by reducing the transistor threshold voltages, the drive current of transistors 230*a–x* and 240*a–x* is increased, providing increased performance.

Figure 4:
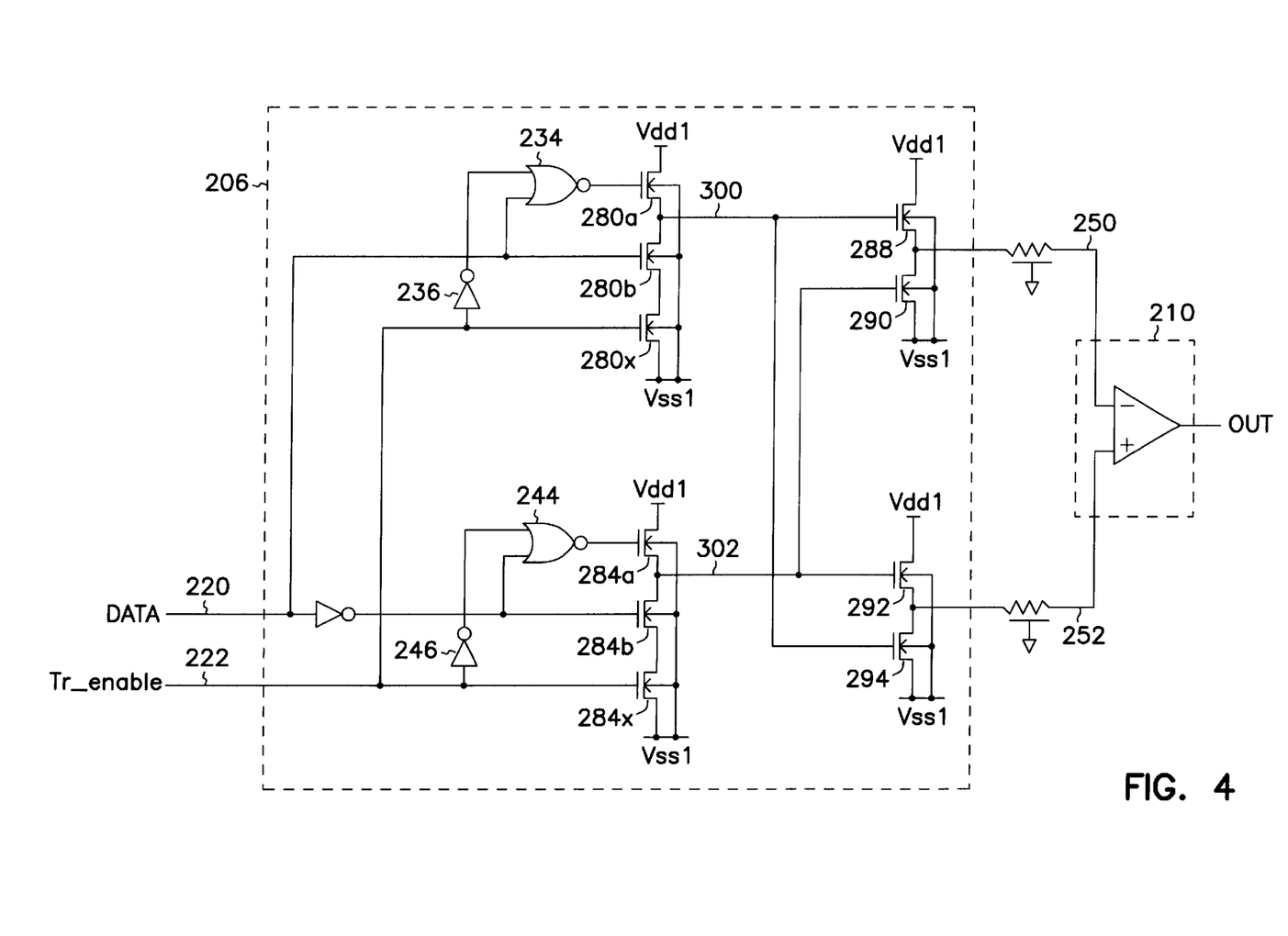
FIG. 4 is a schematic diagram of an alternate driver circuit of the present invention.

Referring to FIG. 4, an alternate driver circuit 206 is illustrated which receives an input signal on node 220 and provides a differential output signal on interconnect lines 250 and 252. The driver circuit 206 also receives a tri-state enable signal (Tr-enable) on node 222 to place the differential outputs in a tri-state condition such that additional driver circuits can actively drive the interconnect lines.

The driver circuit includes first series connected transistors 280a, 28b, 280x and second series connected transistors 284a, 284b, 284x. These transistors are preferably n-channel field effect transistors (FET) which provide intermediate outputs 300 and 302. Additional transistors 288–294 are provided to drive the interconnect lines 250 and 252 and define the voltage swing provided in the interconnect lines.

The tri-state enable signal provided on node 222 is coupled to the gate of transistors 280x and 284x. When the Tr_enable signal is in a low state, these transistors are turned off. Likewise, inverters 236 and 246 force NOR gates 234 and 244, respectively, to have a low output. As such, transistors 280a and 284a are turned off. The intermediate outputs 300 and 302, therefore, are placed in a tri-state condition. Transistors 288–294 are also tri-stated, and the interconnects 250 and 252 can be driven by an additional driver circuit.

In operation (Tr_enable is high), true and complementary data signals from input line 220 drive the series NMOS transistors 280a, 280b and 284a, 284b. That is, transistors 280x and 284x are activated and the output of NOR gates 234 and 244 are controlled by true and complementary data signals derived from input line 220. Transistors 280b and 284b are controlled directly by the data signals. The intermediate outputs 300 and 302 transition between Vdd1−Vt and Vss1, where Vt is the threshold voltage drop of transistors 280a or 284a. These intermediate outputs 300 and 302 control the "cascaded" transistors 288, 290, 292 and 294. Transistors 288 and 290 drive interconnect line 250, while transistors 292 and 294 drive interconnect line 252. The cascaded architecture of the driver circuit 206 of FIG. 4 further reduces the interconnect voltages from the voltages experienced with the drivers of FIGS. 2 and 3. That is, by reducing the voltage swing on the intermediate outputs 300 and 302, the interconnect voltages are further reduced by the threshold voltages of transistors 288–294.

Figure 5:
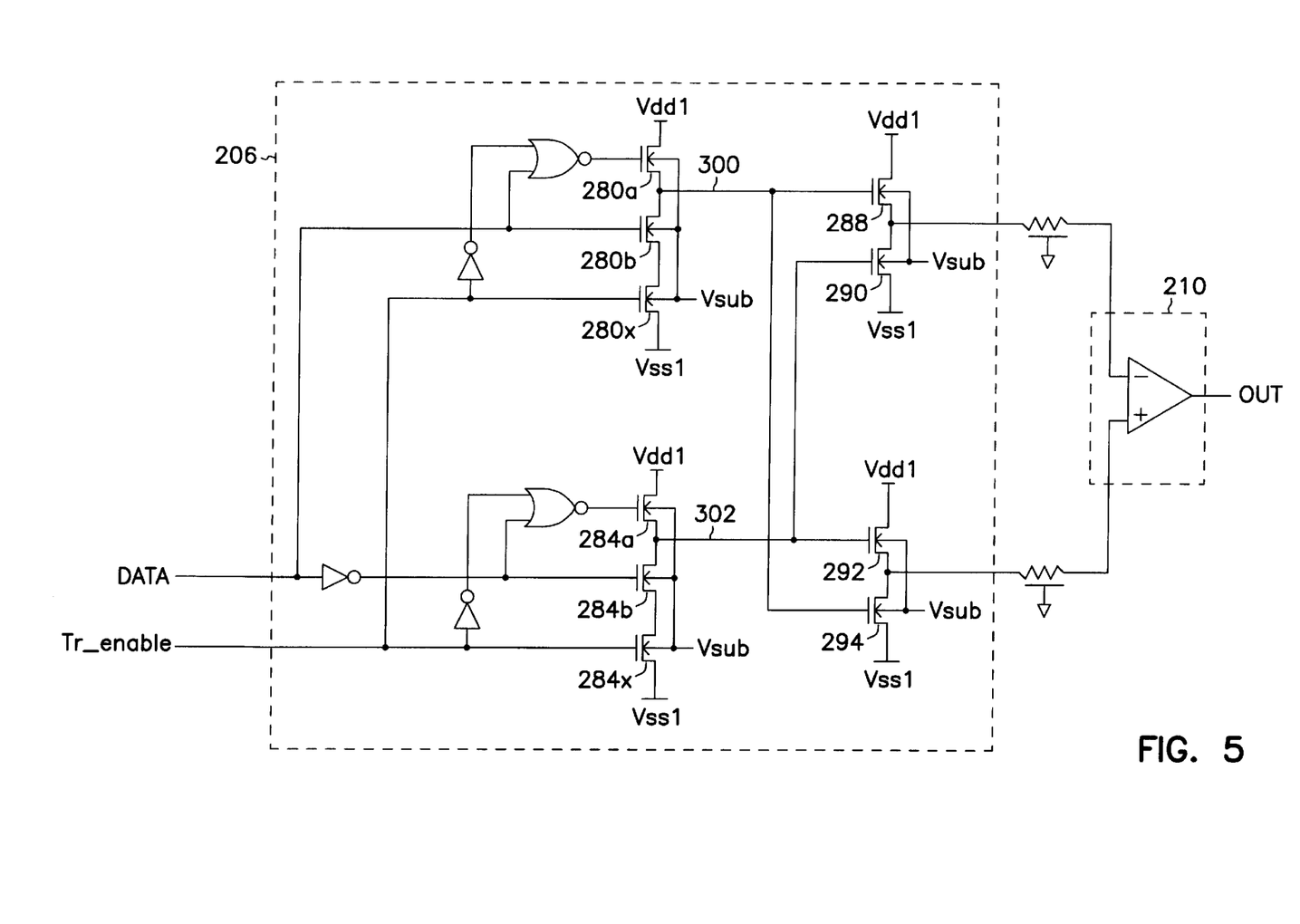
FIG. 5 is a schematic diagram of in alternate driver circuit of the present invention.

While the substrate connection for the drive transistors 288–294 are coupled to Vss1, in the embodiment of FIG. 4, an alternate driver circuit 206 is illustrated in FIG. 5 where the substrate connection for the drive transistors 288–294 are coupled to a substrate voltage, Vsub, which is greater than Vss1. As explained above, the voltage transitions on interconnect lines 250 and 252 are suppressed by the back-bias applied to the substrate rails (Vsub–Vss1). While the increase in back-bias reducing the transistor threshold voltages and increases the voltage swing on the interconnect, the drive current of transistors is increased and provides an increase in performance.

The above described drivers reduce the voltage swing across the integrated circuit interconnects. Since the voltage swing across the interconnect is reduced, a linear dynamic power reduction is achieved compared to a static CMOS (full swing) implementation. Power savings are obtained without employing any additional power rails as compared to two additional rails in prior static CMOS-based low swing driver approaches (Vdd2 and Vss2), offering significant layout area savings as well.

The reduced voltage swing across the interconnect lines results in a nearly linear reduction in driver delay compared to full-swing operation. This reduction in driver delay is achieved without a loss in the driver transistors' on-drive voltage ($V_{gs}$). Prior static CMOS-based low swing drivers suffer from a linear reduction in on-drive voltage with reducing voltage swings and hence offer much lesser delay improvements. See Krishnamurthy et al., IEEE/ACM Intl. Symposium on Low Power Electronics and Design, August 1996, pp. 381–386 for a demonstration that a 6% degradation in performance is experienced on 2000 μm data path interconnects with CMOS-based low swing drivers. The present invention enables considerable downsizing of drive transistors for a given delay constraint, leading to further power savings as well as layout area savings. Additionally, repeaterless interconnects can be driven for much longer distances on-chip than prior approaches.

Since the present invention provides a tristate driver, multiple drivers can drive the same interconnect bus (with only one driver's Tr_enable asserted during a given clock phase) significantly improving interconnect routing channel density for a given bus bandwidth. Further, since much longer interconnects can be driven without repeater insertion, bidirectional transceiver techniques employed on full-swing off-chip interconnects may be used. This has the potential to offer a full 2×improvement in bandwidth compared to a unidirectional repeater-based transceiver circuit. In addition, the invention is fully differential and hence achieves high Common Mode Rejection Ratios comparable to single-ended full-swing static-CMOS driver schemes.

Prior driver circuitry applies a fixed source-bulk voltage of Vss2 on the driver's NMOS pull-down transistor (not shown), contributing to body effect and degrading performance. As the interconnect voltage swing decreases, Vss2 increases, increasing body effect and further degrading performance. In the present invention, the NMOS driver pull-up transistor 230a or 288a suffers from a transient body effect as the output charges towards Vddl; the body effect is maximized only when the output has charged fully to Vdd1−n * Vt. Thus, body effect induced performance loss decreases with reducing interconnect voltage swing. Again, the body terminals of the driver devices can be tied to a positive supply Vsub>Vss1, as explained above. This essentially forward biases the source-drain junctions and reduces the driver devices threshold voltage, contributing to delay improvement.

Figure 6:
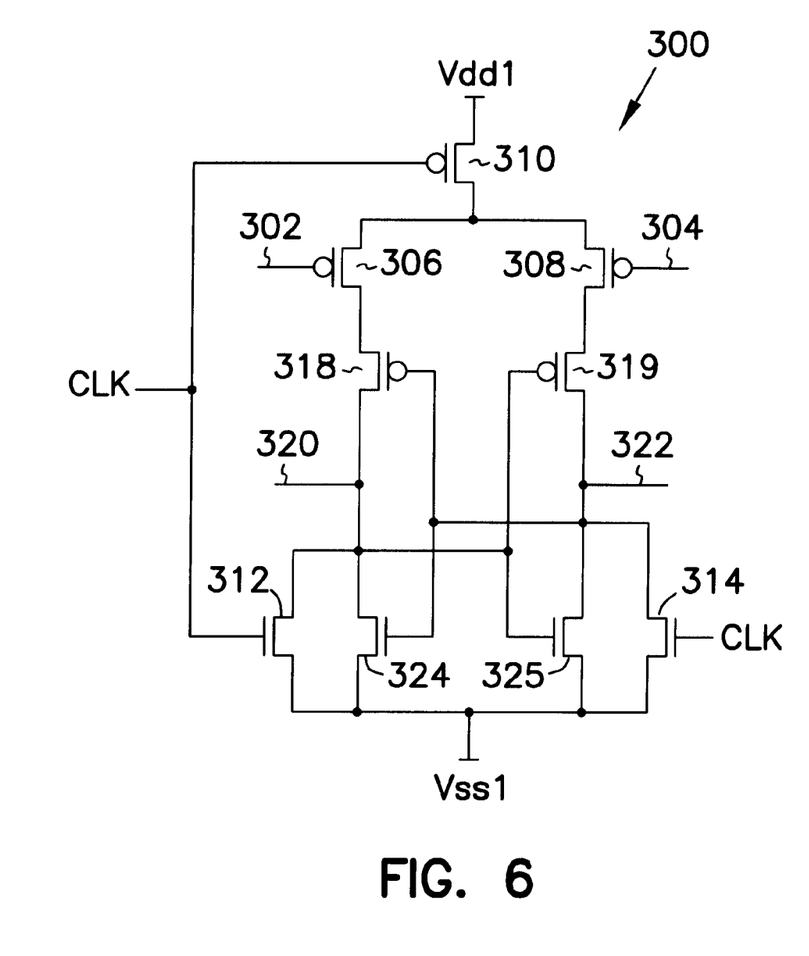
FIG. 6 is a schematic diagram of a differential sense amplifier circuit.

A fully differential current-latch sense amplifier 210 regenerates a regular swing (Vdd1–Vss1) output at the receiving end of the interconnects in response to the differential signals on lines 250 and 252 from the drivers illustrated in FIGS. 2–5. One embodiment of the differential sense amplifier circuit is illustrated in FIG. 6. The sense amplifier 300 includes inputs 302 and 304 for receiving differential interconnect signals, such as provided on interconnects 250 and 252. PMOS transistors 306 and 308 are used to couple the differential signals to cross-coupled PMOS transistors 318 and 319. Cross coupled NMOS transistors 324 and 325 are provided to selectively couple sense amplifier outputs 320 and 322 to Vss. In operation, when a control, or clock (CLK), signal is high, transistor 310 is turned off and transistors 312 and 314 couple outputs 320 and 322 to Vss. When CLK transitions to a low state, transistor 310 is activated and the differential voltages provided on inputs 302 and 304 activate either transistor 306 or 308. As such, one output connection is pulled low through NMOS transistor 324 or 325, and the other output connection is pulled high through PMOS transistor 318 or 319. It will be appreciated by those skilled in the art, that additional sense amplifier circuits can be provided to receive and detect signals on the interconnect lines.

A driver circuit for on-chip interconnects is described which does not require an additional power supply. The driver reduces interconnect voltage swing and power consumption, while improving the speed performance of the interconnect. The driver includes series coupled drive transistors to provide differential signals on the integrated circuit interconnects. The driver circuit can also include circuitry to place the interconnects in a tri-state condition to allow for shared interconnects.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An interconnect driver circuit comprising:
   first series connected transistors coupled between voltage supply connections, the first series connected transistors to drive a first voltage signal on a first intercomnect in response to a data signal, the first voltage signal has a voltage swing which is less than a voltage differential between the voltage supply connections;
   second series connected transistors coupled between the voltage supply connections, the second series connected transistors to drive a second voltage signal on a second interconnect in response to a complement of the data signal, the second voltage signal has a voltage swing which is less than the voltage differential between the voltage supply connections;
   third series connected transistors coupled between the voltage supply connections comprising a first n-channel transistor having a gate coupled to the first interconnect and a second n-channel transistor having a gate coupled to the second interconnect; and
   fourth series connected transistors coupled between the voltage supply connections comprising a third n-channel transistor having a gate coupled to the first interconnect and a fourth n-channel transistor having a gate coupled to the second interconnect;
   wherein the first and second series transistors each comprise:
      a pull-up transistor connected between the first or second interconnect and an upper supply voltage connection; and
      a pull-down transistor connected between the first or second interconnect and
      a tri-state transistor, the tri-state transistor connected between the pull-down transistor and a lower supply voltage connection.

2. The interconnect driver circuit of claim 1 wherein the pull-up transistor, pull-down transistor, and tri-state transistor are n-channel transistors.

3. The interconnect driver circuit of claim 2 wherein a substrate connection of the pull-up transistor, pull-down transistor, and tri-state transistor are coupled to a bias voltage greater than the lower supply voltage connection.

4. The interconnect driver circuit of claim 1 wherein the tri-state circuitry comprises:
   an input to receive an enable signal, the input coupled to a control connection of the tri-state transistor for disabling the tri-state transistor in response to the enable signal; and
   logic circuitry connected to a control connection of the pull-up transistor for disabling the pull-up transistor.

5. An interconnect driver circuit comprising:
   first series connected transistors coupled between voltage supply connections, the first series connected transistors to drive a first voltage signal on a first interconnect in response to a data signal, the first voltage signal has a voltage swing which is less than a voltage differential between the voltage supply connections;
   second series connected transistors coupled between the voltage supply connections, the second series connected transistors to drive a second voltage signal on a second interconnect in response to a complement of the data signal, the second voltage signal has a voltage swing which is less than the voltage differential between the voltage supply connections; and
   third and fourth series transistors coupled to control the first and second series transistors, the third and fourth series transistors each comprise:
      a pull-up transistor connected to both the first and second series transistors and an upper supply voltage connection; and
      a pull-down transistor connected to both the first and second series transistors; and
      a tri-state transistor, the tri-state transistor connected between the pull-down transistor and a lower supply voltage connection.

6. An interconnect driver circuit comprising:
   first series connected transistors coupled between voltage supply connections, the first series connected transistors to provide a first voltage signal on a first intermediate node in response to a data signal, the first voltage signal has a voltage swing which is less than a voltage differential between the voltage supply connections;
   second series connected transistors coupled between the voltage supply connections, the second series connected transistors to provide a second voltage signal on a second intermediate node in response to a complement of the data signal, the second voltage signal has a voltage swing which is less than the voltage differential between the voltage supply connections;
   a first pull-up transistor coupled between a first interconnect and an upper voltage supply connection, a control input of the first pull-up transistor is coupled to the first intermediate node;
   a second pull-up transistor coupled between a second interconnect and the upper voltage supply connection, a control input of the second pull-up transistor is coupled to the second intermediate node;
   a first pull-down transistor coupled between the first interconnect and a lower voltage supply connection, a control input of the first pull-down transistor is coupled to the second intermediate node;
   a second pull-down transistor coupled between the second interconnect and the lower voltage supply connection, a control input of the second pull-down transistor is coupled to the first intermediate node, and
   tri-state circuitry coupled to the first and second series connected transistors for placing the first and second interconnects in a tri-state condition, the tri-state circuitry comprising a first switch coupled in series with the first series connected transistors and a second switch coupled in series with the second series connected transistors, the first and second switch are selectively activated in response to an enable signal.

7. An interconnect driver circuit comprising:
   first series connected transistors coupled between voltage supply connections, the first series connected transistors to provide a first voltage signal on a first intermediate node in response to a data signal, the first voltage signal has a voltage swing which is less than a voltage differential between the voltage supply connections;

second series connected transistors coupled between the voltage supply connections, the second series connected transistors to provide a second voltage signal on a second intermediate node in response to a complement of the data signal, the second voltage signal has a voltage swing which is less than the voltage differential between the voltage supply connections;

a first pull-up transistor coupled between a first interconnect and an upper voltage supply connection, a control input of the first pull-up transistor is coupled to the first intermediate node;

a second pull-up transistor coupled between a second interconnect and the upper voltage supply connection, a control input of the second pull-up transistor is coupled to the second intermediate node;

a first pull-down transistor coupled between the first interconnect and a lower voltage supply connection, a control input of the first pull-down transistor is coupled to the second intermediate node; and a second pull-down transistor coupled between the second interconnect and the lower voltage supply connection, a control input of the second pull-down transistor is coupled to the first intermediate node, wherein the first and second series connected transistors, first and second pull-up transistor, and first and second pull-down transistor are n-channel transistors.

8. The interconnect driver circuit of claim 7 wherein a substrate connection of the first and second series connected transistors, first and second pull-up transistor, and first and second pull-down transistor are coupled to a bias voltage greater than the lower supply voltage connection.

9. The interconnect driver circuit of claim 6 wherein the tri-state circuitry further comprises:

an input to receive an enable signal; and logic circuitry connected to the input, the input and logic circuitry are to disable the first and second series connected transistors in response to the enable signal.

10. An integrated circuit device comprising:

first and second differential interconnects;

a receiver circuit connected to the first and second differential interconnects for detecting a differential voltage provided thereon; and a driver circuit connected to the first and second differential interconnects for providing the differential voltage, the driver circuit is connected to a single voltage supply and the differential voltage has a voltage swing which is less than a voltage differential of the single voltage supply, the driver circuit comprises:

first series connected transistors, comprising first and second n-channel transistors, coupled to the single voltage supply, the first series connected transistors to drive a first voltage signal on the first interconnect;

second series connected transistors, comprising third and fourth n-channel transistors, coupled to the single voltage supply, the second series connected transistors to drive a second voltage signal on the second interconnect;

third series connected transistors coupled to the single voltage supply, the third series transistors to drive gates of the first and third n-channel transistors in response to a data signal;

fourth series connected transistors coupled to the single voltage supply, the fourth series transistors to drive gates of the second and fourth n-channel transistors in response to a complement of the data signal; and tri-state circuitry coupled to the third and fourth series connected transistors for placing the first and second interconnects in a tri-state condition, the tri-state circuitry comprising a first switch coupled in series with the third series connected transistors and a second switch coupled in series with the fourth series connected transistors, the first and second switch are selectively activated in response to an enable signal.

11. An integrated circuit device comprising:

first and second differential interconnects;

a receiver circuit connected to the first and second differential interconnects for detecting a differential voltage provided thereon; and a driver circuit connected to the first and second differential interconnects for providing the differential voltage, the driver circuit is connected to a single voltage supply and the differential voltage has a voltage swing which is less than a voltage differential of the single voltage supply, the driver circuit comprises:

first series connected transistors, comprising first and second n-channel transistors, coupled to the single voltage supply, the first series connected transistors to drive a first voltage signal on the first interconnect;

second series connected transistors comprising third and fourth n-channel transistors, coupled to the single voltage supply, the second series connected transistors to drive a second voltage signal on the second interconnect;

third series connected transistors coupled to the single voltage supply, the third series transistors to drive gates of the first and third n-channel transistors in response to a data signal;

fourth series connected transistors compiled to the single voltage supply, the fourth series transistors to drive gates of the second and fourth n-channel transistors in response to a complement of the data signal; and tri-state circuitry coupled to the third and fourth series connected transistors for placing the first and second interconnects in a tri-state condition, wherein the third and fourth series connected transistors each comprise:

a pull-up transistor connected between the gate of the first or second n-channel transistor and an upper supply voltage connection; and a pull-down transistor connected between the pull-up transistor and a tri-state transistor, the tri-state transistor connected between the pull-down transistor and a lower supply voltage connection.

12. The integrated circuit device of claim 11 wherein the pull-up, pull-down, and tri-state transistors are n-channel FET transistors with a substrate connection coupled to a bias voltage greater than a lower supply voltage connection.

13. The integrated circuit device of claim 11 wherein the tri-state circuitry comprises:

an input connection to receive an enable signal, the input connection coupled to a control connection of the tri-state transistor for disabling the tri-state transistor during a tristate condition; and a NOR gate connected to a control connection of the pull-up transistor for disabling the pull-up transistor during the tristate condition.

14. The integrated circuit device of claim 10 wherein the receiver circuit comprises a differential sense amplifier circuit connected to the first and second interconnects.

15. An interconnect driver circuit comprising:
- first series connected transistors coupled between upper and lower voltage supply connections, the first series connected transistors to drive a first voltage signal on a first interconnect, the first voltage signal has a voltage swing which is less than a voltage differential between the upper and lower voltage supply connections; and
- second series connected transistors coupled between the upper and lower voltage supply connections, the second series connected transistors to drive a second voltage signal on a second interconnect, the second voltage signal has a voltage swing which is less than the voltage differential between the upper and lower voltage supply connections;
- third series connected transistors coupled between the upper and lower voltage supply connections, the third series transistors to drive a gate of at least one of the first series connected transistors and a gate of at least one of the second series transistors in response to a data signal; and
- fourth series connected transistors coupled between the upper and lower voltage supply connections, the fourth series transistors to drive a gate of at least one of the first series connected transistors and a gate of at least one of the second series connected transistors in response to a complement of the data signal;
- wherein at least one of the first series connected transistors and at least one of the second series connected transistors include a substrate connection that is connected to a bias voltage that is greater than the lower supply voltage.

16. The interconnect driver circuit of claim 15 further comprising:
- tri-state circuitry coupled to the third and fourth series connected transistors for placing the first and second interconnects in a tri-state condition.

17. The interconnect driver circuit of claim 15 wherein the third and fourth series transistors each comprise:
- a pull-up transistor connected between the first or second interconnect and an upper supply voltage connection; and
- a pull-down transistor connected between the first or second interconnect and
- a tri-state transistor, the tri-state transistor connected between the pull-down transistor and a lower supply voltage connection.

18. The interconnect driver circuit of claim 17 wherein the pull-up transistor, pull-down transistor, and tri-state transistor are n-channel transistors.

19. The interconnect driver circuit of claim 18 wherein a substrate connection of the pull-up transistor, pull-down transistor, and tri-state transistor are coupled to a bias voltage greater than the lower supply voltage connection.

20. The interconnect driver circuit of claim 17 wherein the tri-state circuitry comprises:
- an input to receive an enable signal, the input coupled to a control connection of the tristate transistor for disabling the tri-state transistor in response to the enable signal; and
- logic circuitry connected to a control connection of the pull-up transistor for disabling the pull-up transistor.

21. An interconnect driver circuit comprising:
- first series connected transistors coupled between upper and lower voltage supply connections, the first series connected transistors to provide a first voltage signal on a first intermediate node in response to a data signal, the first voltage signal has a voltage swing which is less than a voltage differential between the upper and lower voltage supply connections;
- second series connected transistors coupled between the upper and lower voltage supply connections, the second series connected transistors to provide a second voltage signal on a second intermediate node in response to a complement of the data signal, the second voltage signal has a voltage swing which is less than the voltage differential between the upper and lower voltage supply connections, wherein at least one of the first series connected transistors and at least one of the second series connected transistors include a substrate connection that is connected to a bias voltage that is greater than the lower supply voltage;
- a first pull-up transistor coupled between a first interconnect and an upper voltage supply connection, a control input of the first pull-up transistor is coupled to the first intermediate node;
- a second pull-up transistor coupled between a second interconnect and the upper voltage supply connection, a control input of the second pull-up transistor is coupled to the second intermediate node;
- a first pull-down transistor coupled between the first interconnect and a lower voltage supply connection, a control input of the first pull-down transistor is coupled to the second intermediate node; and
- a second pull-down transistor coupled between the second interconnect and the lower voltage supply connection, a control input of the second pull-down transistor is coupled to the first intermediate node.

22. The interconnect driver circuit of claim 21 further comprising:
- tri-state circuitry coupled to the first and second series connected transistors for placing the first and second interconnects in a tri-state condition.

23. The interconnect driver circuit of claim 21 wherein the first and second series connected transistors, first and second pull-up transistor, and first and second pull-down transistor are n-channel transistors.

24. The interconnect driver circuit of claim 23 wherein a substrate connection of the first and second series connected transistors, first and second pull-up transistor, and first and second pull-down transistor are coupled to a bias voltage greater than the lower supply voltage connection.

25. The interconnect driver circuit of claim 22 wherein the tri-state circuitry comprises:
- an input to receive an enable signal; and
- logic circuitry connected to the input, the input and logic circuitry are to disable first and second series connected transistors in response to the enable signal.

26. An integrated circuit device comprising:
- first and second differential interconnects;
- a receiver circuit connected to the first and second differential interconnects for detecting a differential voltage provided thereon; and
- a driver circuit connected to the first and second differential interconnects for providing the differential voltage, the driver circuit is connected to a single voltage supply and the differential voltage has a voltage swing which is less than a voltage differential of the single voltage supply, the driver circuit comprises:
  - first series connected transistors, comprising first and second transistors, coupled to the single voltage supply, the first series connected transistors to drive a first voltage signal on the first interconnect;

second series connected transistors, comprising third and fourth transistors, coupled to the single voltage supply, the second series connected transistors to drive a second voltage signal on the second interconnect, wherein at least one of the first series connected transistors and at least one of the second series connected transistors include a substrate connection that is connected to a bias voltage that is not equal to the single supply voltage;

third series connected transistors coupled to the single voltage supply, the third series transistors to drive gates of the first and third transistors in response to a data signal;

fourth series connected transistors coupled to the single voltage supply, the fourth series transistors to drive gates of the second and fourth transistors in response to a complement of the data signal; and tri-state circuitry coupled to the third and fourth series connected transistors for placing the first and second interconnects in a tri-state condition.

27. The integrated circuit device of claim 26 wherein the third and fourth series connected transistors each comprise:

a pull-up transistor connected between the first or second interconnect and an upper supply voltage connection; and a pull-down transistor connected between the first or second interconnect and a tri-state transistor, the tri-state transistor connected between the pull-down transistor and a lower supply voltage connection.

28. The integrated circuit device of claim 27 wherein the pull-up, pull-down, and tri-state transistors are n-channel FET transistors with a substrate connection coupled to a bias voltage greater than the lower supply voltage connection.

29. The integrated circuit device of claim 26 wherein the tri-state circuitry comprises:

an input connection to receive an enable signal, the input connection coupled to a control connection of the tri-state transistor for disabling the tri-state transistor during a tristate condition; and a NOR gate connected to a control connection of the pull-up transistor for disabling the pull-up transistor during the tristate condition.

30. The integrated circuit device of claim 26 wherein the receiver circuit comprises a differential sense amplifier circuit connected to the first and second interconnects.

* * * * *

UNITED STATES PATENT AND TRADEMARK OFFICE
CERTIFICATE OF CORRECTION

PATENT NO. : 6,181,166 B1
DATED : January 30, 2001
INVENTOR(S) : Krishnamurthy et al.

It is certified that error appears in the above-identified patent and that said Letters Patent is hereby corrected as shown below:

Column 1,
Line 13, delete "Iong" and insert -- long --, therefor.
Line 38, insert -- A -- before "driver".
Line 44, insert -- ( -- before "Vdd2".

Column 4,
Line 35, delete "VddI" (letter L) and insert -- Vdd1 -- (numeral 1), therefor.

Column 6,
Line 32, delete "VddI" (letter L) and insert -- Vdd1 -- (numeral 1), therefor.

Claim 1, column 7,
Line 18, delete "intercomnect" and insert -- interconnect --, therefor.

Claim 11, column 10,
Line 34, delete "compiled" and insert -- coupled --, therefor.

Signed and Sealed this

Twenty-fifth Day of September, 2001

Attest:

*Nicholas P. Godici*

NICHOLAS P. GODICI
*Acting Director of the United States Patent and Trademark Office*

*Attesting Officer*